(12) United States Patent
Dams et al.

(10) Patent No.: US 7,280,182 B2
(45) Date of Patent: Oct. 9, 2007

(54) LITHOGRAPHIC APPARATUS, DEVICE MANUFACTURING METHOD AND COMPUTER PROGRAM

(75) Inventors: Johannes Adrianus Antonius Theodorus Dams, Veldhoven (NL); Robrecht Emiel Maria Leonia De Weerdt, Hoogstraten (BE)

(73) Assignee: ASML Netherlands B.V., Veldhoven (NL)

( * ) Notice: Subject to any disclaimer, the term of this patent is extended or adjusted under 35 U.S.C. 154(b) by 601 days.

(21) Appl. No.: 10/820,228

(22) Filed: Apr. 8, 2004

(65) Prior Publication Data

US 2004/0257548 A1 Dec. 23, 2004

(30) Foreign Application Priority Data

Apr. 9, 2003 (EP) .................................. 03252247

(51) Int. Cl.
*C03B 27/32* (2006.01)
*C03B 27/42* (2006.01)
(52) U.S. Cl. ......................................... 355/53; 355/77
(58) Field of Classification Search .................. 355/53, 355/72, 75, 77
See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,523,193 | A | 6/1996 | Nelson |
| 5,969,441 | A | 10/1999 | Loopstra et al. |
| 6,008,610 | A | 12/1999 | Yuan et al. |
| 6,046,792 | A | 4/2000 | Van Der Werf et al. |
| 6,597,433 | B1 | 7/2003 | Renkens et al. |
| 6,809,798 | B1 * | 10/2004 | Fujita ........................... 355/53 |
| 7,016,019 | B2 * | 3/2006 | Van Den Biggelaar et al. ........................... 355/72 |
| 2002/0185983 | A1 | 12/2002 | Poon et al. |

FOREIGN PATENT DOCUMENTS

| EP | 1 262 835 | 12/2002 |
| JP | 10-116779 | 5/1998 |
| JP | 2004-153094 | 5/2004 |
| WO | WO98/33096 | 7/1998 |
| WO | WO98/38597 | 9/1998 |
| WO | WO98/40791 | 9/1998 |

* cited by examiner

*Primary Examiner*—Rodney Fuller
(74) *Attorney, Agent, or Firm*—Pillsbury Winthrop Shaw Pittman LLP (57) ABSTRACT

In a scanning exposure, the short stroke module accelerates the mask or substrate table with a higher acceleration that the long stroke module. The short stroke module starts at or near (proximate) one extreme of its range of motion and catches up to the long stroke module during the scan. The long stroke module starts to decelerate earlier but the short stroke decelerates faster so that the short stroke overtakes the long stroke and ends up at the other extreme of its range of motion. The acceleration times can be reduced without increasing the forces exerted by the long stroke actuators so there is less of an increase in dissipation and reaction forces.

7 Claims, 6 Drawing Sheets

LITHOGRAPHIC APPARATUS, DEVICE MANUFACTURING METHOD AND COMPUTER PROGRAM

FIELD OF THE INVENTION

The present invention relates generally to a lithographic projection apparatus and more particularly to lithographic projection apparatus including a positioning system employing long and short stroke modules.

BACKGROUND OF THE INVENTION

The term "patterning device" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning devices as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

In a step-and-scan lithographic projection apparatus, often referred to as a scanner, the mask table and the substrate table are moved in synchronism (with the substrate table moving at a speed M times the speed of the mask table, where M is the magnification of the projection lens, e.g. ¼) to scan the illumination field across the pattern on the mask and thereby project a pattern larger than the illumination field onto a target portion on the substrate. The substrate table is then stepped in the direction perpendicular to the scanning direction and the next target portion is exposed by a scan in the opposite direction. The mask table moves back and forth while the substrate table follows a meander path to expose a row or column of target portions.

Often, the positioning systems of the mask and substrate tables will be divided into long stroke module and a short stroke module which is mounted between the long stroke module and the table. The long stroke module has a range of movement of several hundred mm and an accuracy of a few μm while the short stroke module has a range of movement of a few mm but an accuracy measured in nm. A known control arrangement, sometimes referred to as a master-slave control system, uses the desired position of the table as the setpoint for the short stroke control loop while the long stroke control loop aims to keep the long stroke module in a fixed position relative to the short stroke module so that the short stroke module is at the center of its range of movement. Thus if a move is commanded, the short stroke module heads off in the desired direction while the long stroke module tries to keep up. Normally, the delay in the long stroke control loop is small so that the excursions of the short stroke module from the center of its range of movement are small.

To increase throughput of the apparatus, the speed of the scan could be increased however that is limited by the width of the illumination field, in turn limited by the size of the projection system, and by the intensity of the projection beam, limited by the power of the radiation source. Thus it is not easy, or in some cases not possible, to increase the scan speed. An alternative route to increasing throughput is to reduce the non-scanning time, i.e. acceleration time, deceleration time and settling time. One way of doing this is to increase the accelerations of the long and short stroke modules. That means increasing the power of the drives, which leads to increased dissipation which can cause thermal problems with the measurement systems or in the actuators. Also, increased accelerations cause increased disturbance forces and/or increased excursions of the balance masses.

SUMMARY OF THE INVENTION

Embodiments of the present invention provide a lithographic projection apparatus in which stage positioning can be achieved rapidly without a corresponding increase in dissipation and reaction forces.

An embodiment of the present invention includes a lithographic apparatus having a control system adapted to control long and short stroke modules to apply a desired acceleration to an object by controlling the short stroke module to apply the desired acceleration to the object and to control the long stroke module to apply a smaller acceleration.

By applying a smaller acceleration to the long stroke module, the dissipation in the long stroke module actuators is reduced, as are reaction forces. This means that the short stroke module can be used to apply a larger acceleration, getting the positioned object to the desired speed faster. Non-scanning time is thereby reduced and throughput increased. Of course, this means that long stroke module does not keep up with the short stroke module and so the extent of the difference in accelerations is limited by the range of movement of the short stroke module. Nevertheless, because the mass driven by the long stroke module is much greater, e.g. about 4 or 5 times greater, than that driven by the short stroke module a significant decrease in dissipation and reaction forces can be achieved. The invention is applicable to both positive accelerations and negative accelerations (decelerations).

Embodiments of the present invention is operable in a series of scanned exposures of target portions when alternate exposures are carried out in opposite directions. In this case, the short stroke module will begin accelerating to perform a first exposure at one extreme of its range of motion, effectively behind the long stroke module. As the driven object is accelerated to scanning speed, the short stroke module catches up with the long stroke module, which is accelerating more slowly and takes longer to reach scanning speed. At the end of the exposure, the long stroke module begins deceleration before the short stroke module, which decelerates more quickly. Thus the short stroke module overtakes the long stroke module and when both come to rest the short stroke module is at the other extreme of its range of motion, which is the correct position to begin accelerating to perform an exposure in the opposite direction.

According to a further aspect of embodiments of the invention there is provided a device manufacturing method including providing a substrate that is at least partially covered by a layer of radiation-sensitive material, providing a projection beam of radiation using a radiation system, using a patterning device to endow the projection beam with a pattern in its cross-section, projecting the patterned beam of radiation onto a target portion of the layer of radiation-sensitive material, and positioning at least one of the substrate and the patterning means with a positioning system comprising a long stroke and a short stroke module in series. When accelerating the substrate or the patterning device, the short stroke module drives the substrate or patterning device with a greater acceleration than the long stroke module drives the short stroke module.

An embodiment of the present invention further provides a computer program comprising machine executable code that, when executed on a computer system controlling a lithographic projection apparatus, instructs the computer system to effect the method described above.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

EMBODIMENT 1

Figure 1:
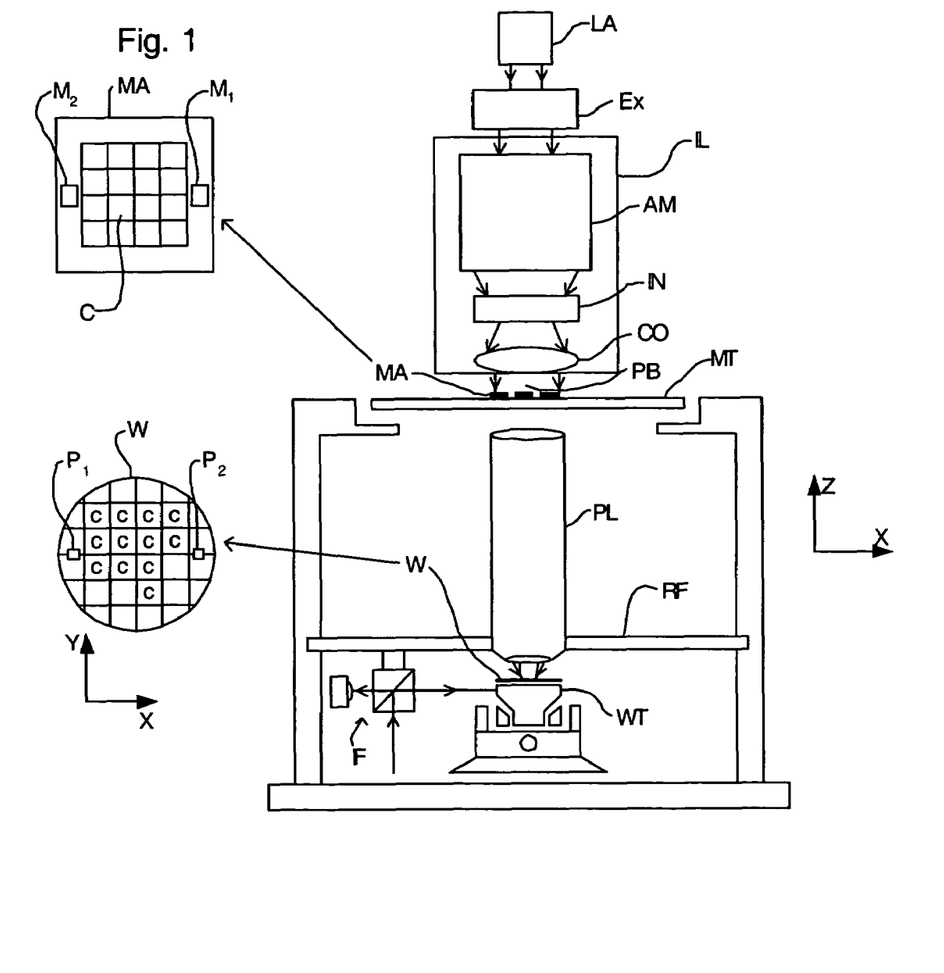
FIG. 1 depicts a lithographic projection apparatus according to an embodiment of the invention.

FIG. 1 schematically depicts a lithographic projection apparatus according to a particular embodiment of the invention. The apparatus includes a radiation system Ex, IL, for supplying a projection beam PB of radiation (e.g. DUV radiation), which in this particular case also comprises a radiation source LA, a first object table (mask table) MT provided with a mask holder for holding a mask MA (e.g. a reticle), and connected to first positioning device for accurately positioning the mask with respect to item PL, a second object table (substrate table) WT provided with a substrate holder for holding a substrate W (e.g. a resist-coated silicon wafer), and connected to second positioning device for accurately positioning the substrate with respect to item PL, a projection system ("lens") PL (e.g. a refractive lens system) for imaging an irradiated portion of the mask MA onto a target portion C (e.g. comprising one or more dies) of the substrate W. As here depicted, the apparatus is of a transmissive type (e.g. has a transmissive mask). However, in general, it may also be of a reflective type, for example (e.g. with a reflective mask). Alternatively, the apparatus may employ another kind of patterning means, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device (and interferometric measuring means IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

FIGS. 2 and 3A-E show how, according to the invention, the acceleration of the object table, mask table or substrate table, is maximized while dissipation and reaction forces are minimized. The graph shows the velocity in the scan, or y, direction of the driven ends of the short stroke module SSm and the long stroke module LSm over the duration of one scan. The driven end of the short stroke module is connected to the object table while the driven end of the long stroke module is connected to the driving end of the short stroke module. The driving end of the long stroke module may be connected to a reaction frame or a balance mass.

Figure 3A:
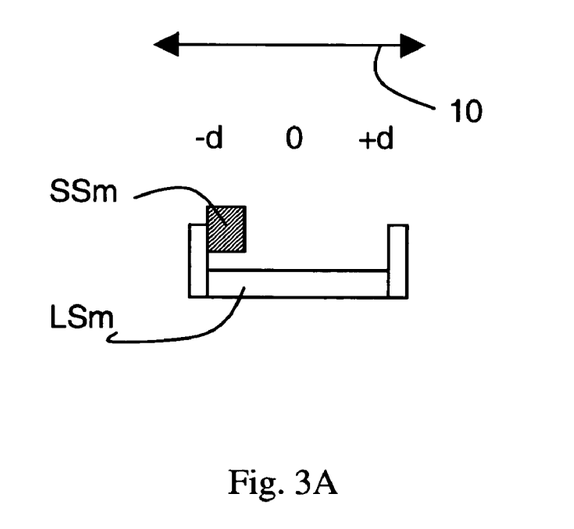
FIGS. 3A to E illustrate the relative positions of the long stroke and short stroke modules during a scan exposure.

At point A the short stroke and long stroke modules are at rest with the short stroke near the negative extreme (−d) of its range of movement in the scan, or y, direction, as shown in FIG. 3A. The scan, or y, direction is indicated by the arrow 10. The relative position of the short stroke module SSm and the long stroke module LSm are schematically depicted in FIGS. 3A to 3E. LSm and SSm are assumed to be displaceable relative to each other in the scan, or y, direction over a range indicated from −d over 0 to +d. Starting from the relative positions as indicated in FIG. 3A, both the short and long stroke modules accelerate in preparation for a scan, with the short stroke accelerating faster.

Figure 2:
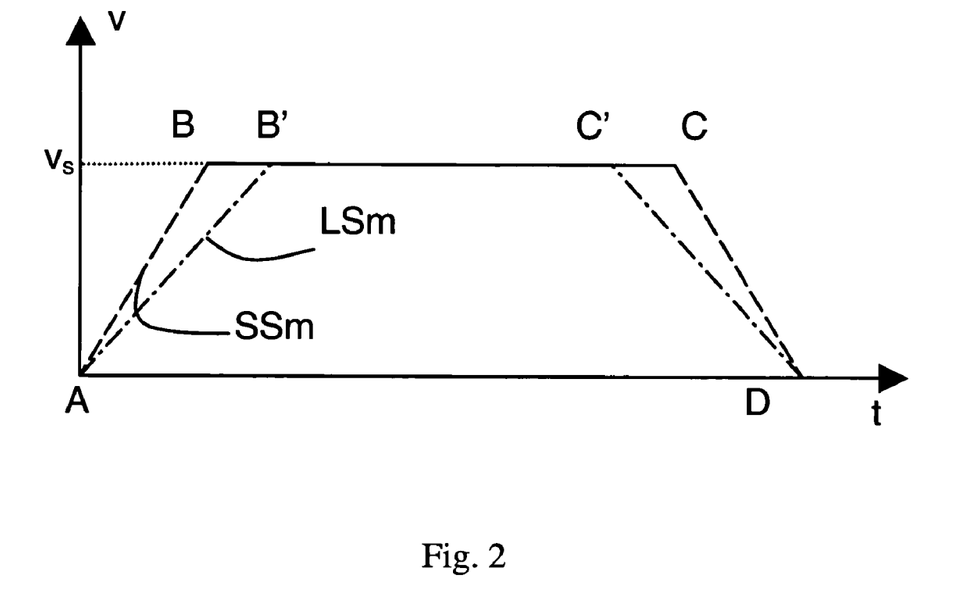
FIG. 2 is a graph of speed vs. time for the long and short stroke modules of an embodiment of the invention during a scan exposure.
Figure 3B:
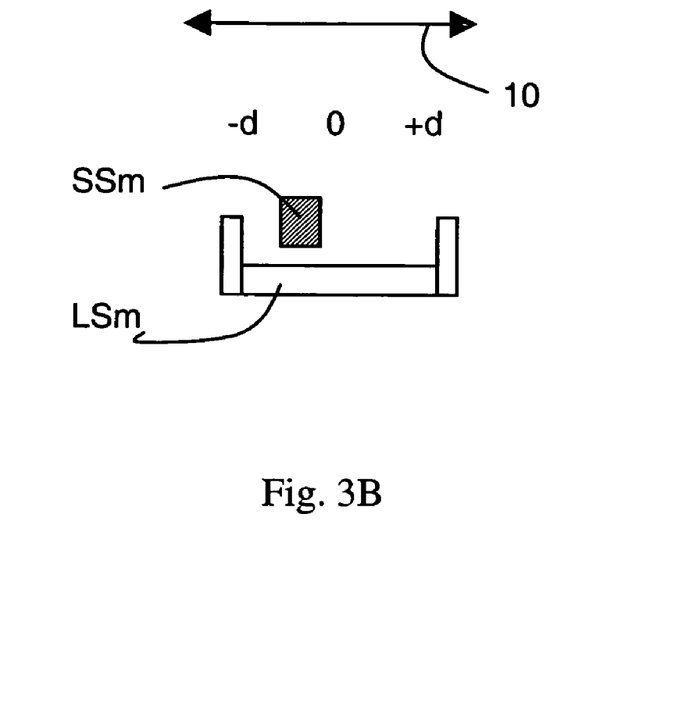
Figure 3C:
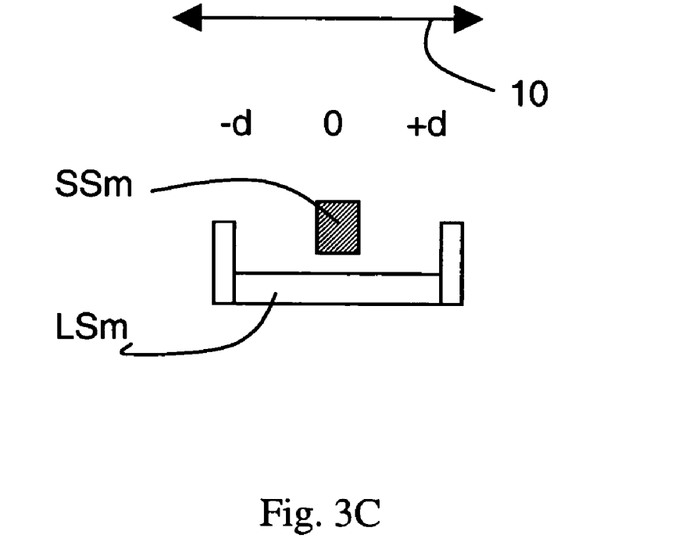

At B, the short stroke module has reached the scan speed, $v_s$. As can be seen in FIG. 2, the long stroke module has not yet reached the scan speed but does so a short while afterwards. Because the short stroke acceleration is greater than that of the long stroke, while the short stroke is moving faster than the long stroke it will be moving relative to the long stroke in the +y direction. FIG. 3B shows the relative position of the SSm and the LSm at point B. At point B, the short stroke module is close to the center of its range of movement. The difference in accelerations between the long and short strokes can be chosen so that, starting at or near, that is, proximate, one extreme, the short stroke reaches the center of its range of motion when the long stroke reaches the scan speed $v_s$. This occurs some time after the short stroke module has reached the scan speed (point B' in FIG. 2). At point B' shown in FIG. 2, the long stroke module and the short stroke module have obtained the same speed, the relative position of both modules is depicted in FIG. 3C. Between points B' and C', the relative position of both modules remains substantially constant. So, the situation shown in FIG. 3C is representative for the period between points B' and C'. At point C', the long stroke module starts to decelerate, while the short stroke module starts to decelerate at point C.

Figure 3D:
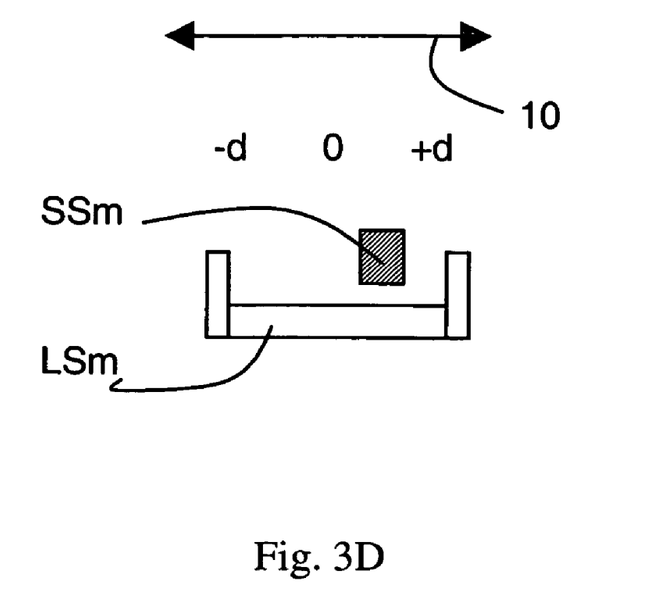

At point C, the long stroke has already begun its deceleration, but at a lower rate. As shown in FIG. 3D, at point C, the short stroke has already moved a little past the center of its range of movement. The scanning exposure can be performed during part or all of the interval from B to C.

Figure 3E:
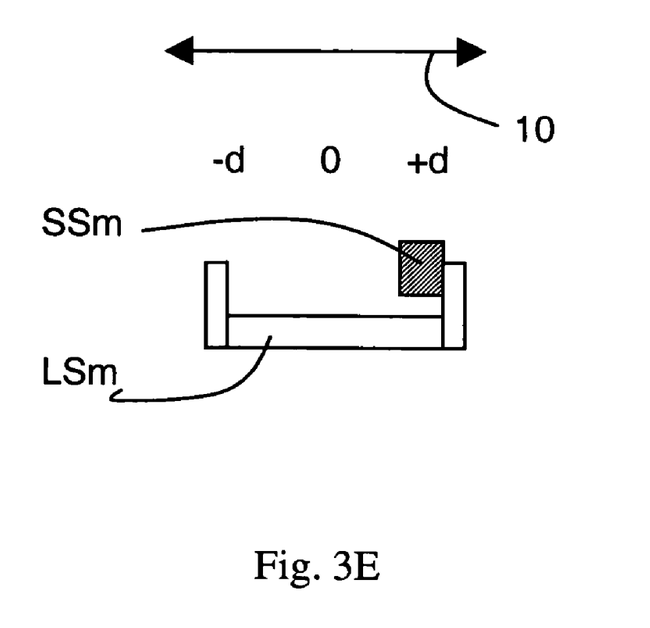

The end of the cycle is at D, where both short stroke and long stroke modules are at rest, with the short stroke near the positive extreme (+d) of its range of motion. This is depicted in FIG. 3E. The short stroke module is thus perfectly positioned to begin a scan in the opposite, −y, direction.

The present invention may be implemented using separate position and/or velocity control loops for the long and short stroke modules rather than a master/slave arrangement. Alternatively, a master/slave arrangement may be retained and the invention implemented by changing the setpoint for the slave loop, controlling the long stroke module, to effect the appropriate relative positions of the long and short stroke modules during a scan exposure.

Figure 4:
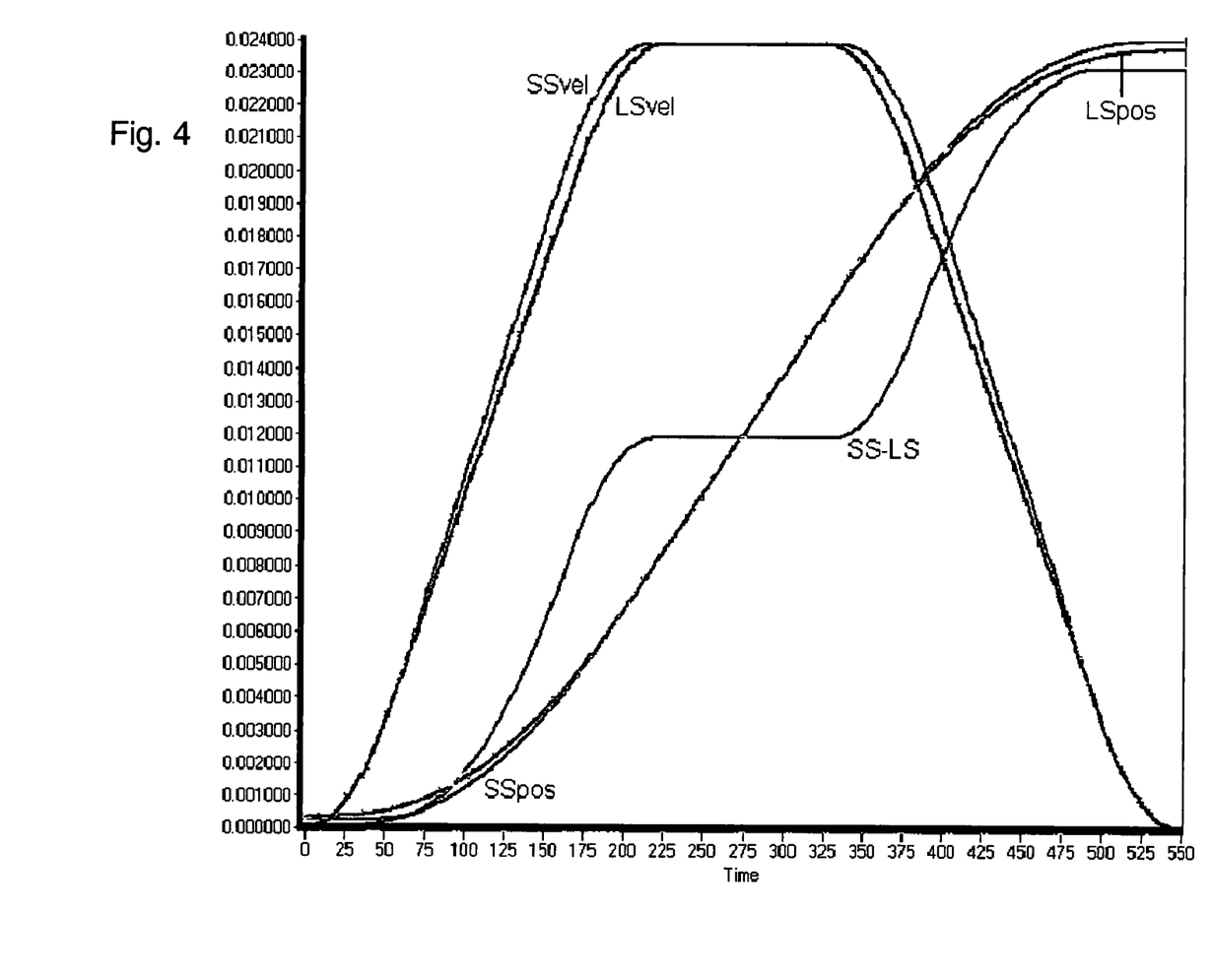
FIGS. 4 and 5 are graphs of the accelerations, absolute positions and relative positions of the short stroke and long stroke modules in two examples of the invention.
Figure 5:
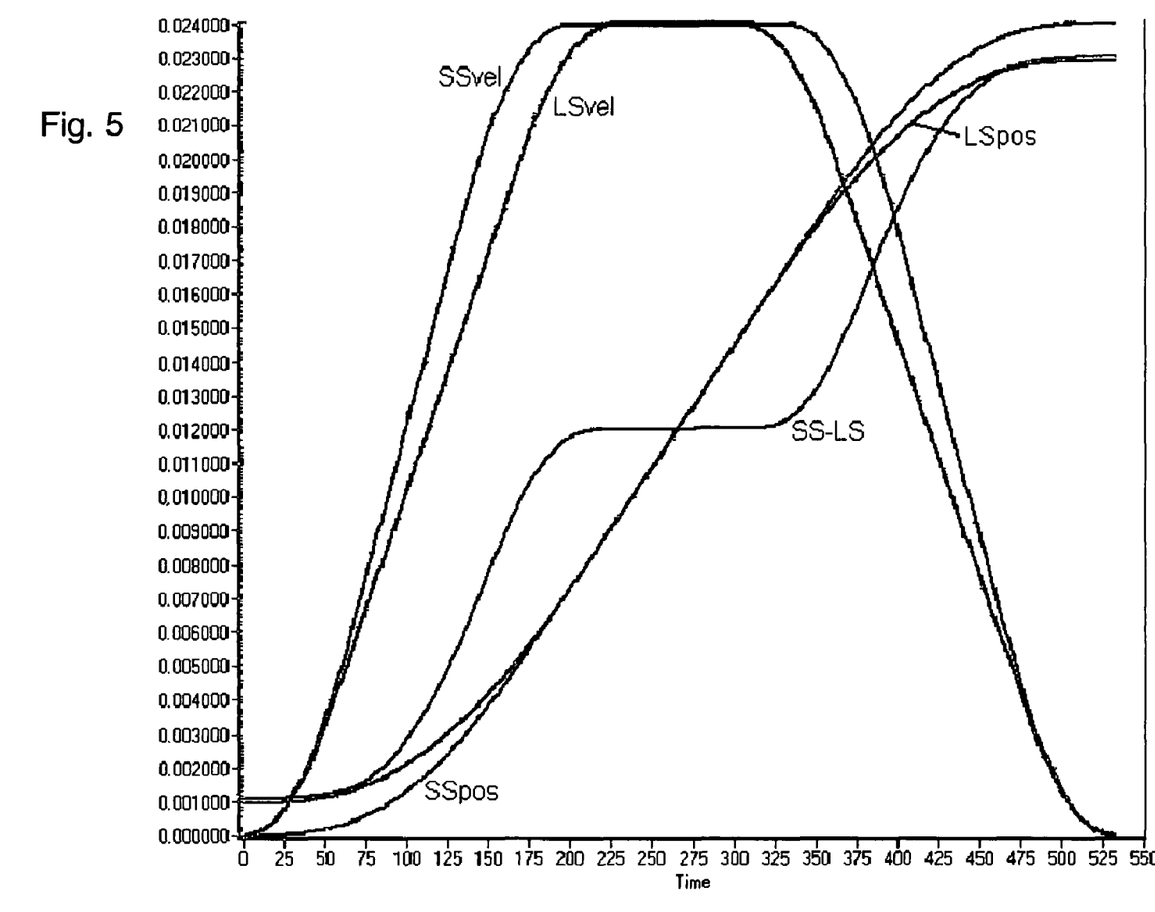

FIGS. 4 and 5 depict the velocities of the short stroke, SSvel, and the long stroke. LSvel, as well as the absolute positions, LSpos and SSpos, of the long and short strokes with the relative position, SS-LS, of the two modules during a scan in two examples of the invention. Units on the graph are arbitrary. It can be seen by comparing FIGS. 4 and 5 that increasing the range of movement of the short stroke module allows a greater difference in accelerations between the long and short stroke stage—the example from which FIG. 5 is derived has about three times the range of movement in the short stroke as that from which FIG. 4 is derived. With a scanning speed of 0.36 $ms^{-1}$ and a maximum long stroke acceleration of 10.5 $ms^{-2}$, a range of movement of ±0.3 mm in the short stroke enables about a 10% increase in short stroke acceleration and a range of movement of about ±1.0 mm enables about a 38% increase.

In a variant of the present embodiment, differential acceleration is only applied during the acceleration phase of an exposure cycle. The short stroke module then accelerates faster than the long stroke so that it moves from at or near one extreme of its range of motion at the start of the cycle to the other extreme at the point when the long stroke module has caught up. The long stroke and short stroke modules move together for the remainder of the constant speed phase and deceleration phase of the exposure cycle.

In this way, a greater differential in accelerations can be applied during the acceleration phase at the cost of no differential during deceleration. This is beneficial since there is a consequentially larger reduction in disturbance forces in the period before an exposure when the apparatus is settling for an exposure. The apparatus is much less sensitive to disturbances in the period after an exposure.

While specific embodiments of the invention have been described above, it will be appreciated that the invention may be practiced otherwise than as described. For example, while the described embodiments apply the invention in the scanning direction, the invention may also be applied in the direction perpendicular to the scanning direction. It will also be appreciated that the present invention may be built into a new lithographic apparatus from scratch or may be embodied in computer software loadable into the controlling computer of an existing lithographic apparatus to effect an upgrade. The description is not intended to limit the invention.

The invention claimed is:

1. A lithographic projection apparatus comprising:
   a support structure configured to support a patterning device, the patterning device serving to pattern a projection beam according to a desired pattern;
   a substrate table configured to hold a substrate;
   a projection system configured to project the patterned beam onto a target portion of the substrate; and
   a positioning system configured to position an object, selected from the group consisting of the support structure and the substrate table, said positioning system having a long stroke module and a short stroke module in series and a control system configured to control the long stroke and short stroke modules to move the positioned object along a desired course at desired speeds, said control system adapted to control said long and short stroke modules to apply a desired acceleration to said object by controlling said short stroke module to apply said desired acceleration to said object and to control said long stroke module to apply a smaller acceleration, said object moving at a substantially constant scanning velocity during a scanned exposure,
   wherein said control system is adapted to control said short stroke module so that said object reaches said constant scanning velocity at or before the beginning of said scanned exposure and to control said long stroke module such that a driven end thereof reaches said scanning speed after the object has reached said scanning speed.

2. An apparatus according to claim 1, wherein said control system is adapted to control said long and short stroke modules such that said driven object starts an exposure cycle at a first position at which it has a speed of zero in the direction parallel to said scanning velocity and said short stroke module is proximate an extreme of its range of movement in the direction opposite to said scanning velocity.

3. An apparatus according to claim 2, wherein said control system is adapted to control said long and short stroke modules such that said short stroke module reaches a position proximate a center of its range of movement in the direction of said scanning velocity when said long stroke module reaches said scanning velocity.

4. An apparatus according to claim 1, wherein said control system is adapted to control said long and short stroke modules such that said driver object ends an exposure cycle at a second position at which it has a speed of zero in the direction parallel to said scanning velocity and said short stroke module is proximate an extreme of its range of movement in the direction of said scanning velocity.

5. A lithographic projection apparatus comprising:
a support structure configured to support a patterning device, the patterning device serving to pattern a projection beam according to a desired pattern;
a substrate table configured to hold a substrate;
a projection system configured to project the patterned beam onto a target portion of the substrate; and
a positioning system configured to position an object, selected from the group consisting of the support structure and the substrate table, said positioning system having a long stroke module and a short stroke module in series and a control system configured to control the long stroke and short stroke modules to move the positioned object along a desired course at desired speeds, said control system adapted to control said long and short stroke modules to apply a desired acceleration to said object by controlling said short stroke module to apply said desired acceleration to said object and to control said long stroke module to apply a smaller acceleration, said object moving at a substantially constant scanning velocity during a scanned exposure,
wherein said control system is adapted to control said long stroke module to begin deceleration before the end of said scanned object begins to decelerate.

6. A device manufacturing method comprising:
projecting a patterned beam of radiation onto a target portion of the layer of radiation-sensitive material on a substrate; and
positioning at least one of the substrate and a patterning device used to pattern the beam with a positioning system comprising a long stroke and a short stroke module in series;
accelerating the substrate or the patterning device by applying a higher acceleration with the short stroke module than with the long stroke module;
moving the object at a substantially constant scanning velocity during a scanned exposure; and
controlling the short stroke module so that the object reaches the constant scanning velocity at or before the beginning of the scanned exposure and controlling the long stroke module such that a driven end thereof reaches the scanning speed after the object has reached the scanning speed.

7. A machine readable medium comprising machine executable instructions for performing a method comprising:
projecting a patterned beam of radiation onto a target portion of the layer of radiation-sensitive material on a substrate; and
positioning at least one of the substrate and a patterning device used to pattern the beam with a positioning system comprising a long stroke and a short stroke module in series;
accelerating the substrate or the patterning device by applying a higher acceleration with the short stroke module than with the long stroke module;
moving the object at a substantially constant scanning velocity during &scanned exposure; and
controlling the short stroke module so that the object reaches the constant scanning velocity at or before the beginning of the scanned exposure and controlling the long stroke module such that a driven end thereof reaches the scanning speed after the object has reached the scanning speed.

* * * * *